United States Patent
Maruyama et al.

(10) Patent No.: US 7,352,013 B2
(45) Date of Patent: *Apr. 1, 2008

(54) SOLID-STATE IMAGING DEVICE AND MANUFACTURING METHOD THEREOF

(75) Inventors: Yasushi Maruyama, Kanagawa (JP); Hideshi Abe, Kanagawa (JP)

(73) Assignee: Sony Corporation (JP)

( * ) Notice: Subject to any disclaimer, the term of this patent is extended or adjusted under 35 U.S.C. 154(b) by 36 days.

This patent is subject to a terminal disclaimer.

(21) Appl. No.: 11/491,901

(22) Filed: Jul. 25, 2006

(65) Prior Publication Data

US 2006/0261369 A1 Nov. 23, 2006

Related U.S. Application Data

(63) Continuation of application No. 11/073,865, filed on Mar. 8, 2005, now Pat. No. 7,105,867, which is a continuation of application No. 09/268,339, filed on Mar. 16, 1999, now Pat. No. 6,867,438.

(30) Foreign Application Priority Data

Mar. 19, 1998  (JP) ............................. P10-070836

(51) Int. Cl.
*H01L 29/74* (2006.01)
(52) U.S. Cl. .................. 257/149; 257/184; 257/192; 257/291; 257/E31.058
(58) Field of Classification Search ........... 257/149, 257/184, 192, 291
See application file for complete search history.

(56) References Cited

U.S. PATENT DOCUMENTS

| | | | |
|---|---|---|---|
| 5,286,669 A | 2/1994 | Maeda et al. | |
| 5,506,429 A | 4/1996 | Tanaka et al. | |
| 5,912,482 A * | 6/1999 | Morimoto | 257/232 |
| 7,105,867 B2 * | 9/2006 | Maruyama et al. | 257/184 |

FOREIGN PATENT DOCUMENTS

| JP | 03-184375 | 8/1991 |
| JP | 05-206437 | 8/1993 |
| JP | 07-211883 | 8/1995 |

OTHER PUBLICATIONS

Japanese Office Action; Application No.: 10-070836; Dated: Feb. 20, 2007.

* cited by examiner

*Primary Examiner*—Wai-Sing Louie
(74) *Attorney, Agent, or Firm*—Rader Fishman & Grauer PLLC; Ronald P. Kananen

(57) ABSTRACT

There is a demand of a solid-state imaging device capable of being driven at a high speed and in which the shading of sensitivity and illuminance defect can be prevented from being caused. A solid-state imaging device (20) comprises a light-receiving sensor section disposed on the surface layer portion of a substrate (21) for performing a photoelectric conversion, a charge transfer section for transferring a signal charge read out from the light-receiving sensor section, a transfer electrode (27) (28) made of polysilicon formed on a substrate (21) at its position approximately above the charge transfer section through an insulating film (26), and an interconnection made of polysilicon and interconnected to the transfer electrode (27) (28). At least one of the polysilicon transfer electrode (27)(28) and the interconnection is formed on a polysilicon layer (27a) (28a) by selectively depositing a high-melting point metal having a resistance value lower than that of polysilicon. Also, there is provided a solid-state imaging device in which a fluctuation of a work function of the transfer electrode can be avoided and a manufacturing method thereof. The solid-state imaging device (10) comprises a buffer layer (1) containing a metal silicide layer (16) is formed between he transfer electrodes (3), (4) and a shunt interconnection layer (7) formed of a metal layer.

1 Claim, 6 Drawing Sheets

SOLID-STATE IMAGING DEVICE AND MANUFACTURING METHOD THEREOF

CROSS REFERENCE TO RELATED APPLICATIONS

The present application is a Continuation Application of patent application Ser. No. 11/073,865, filed on Mar. 8, 2005, which is also a Continuation of 09/268,339, now parent U.S. Pat. No. 6,867,438, issued on Mar. 15, 2005, the entire contents of which is hereby incorporated by reference.

The present application also claims priority based on Foreign Application No. P10-070836 filed on Mar. 19, 1998, the entire contents of which are incorporated herein by reference.

BACKGROUND OF THE INVENTION

1. Field of the Invention

The present invention relates to a solid-state imaging device in which transfer electrodes and interconnections are made of polysilicon and a manufacturing method thereof, and to a solid-state imaging device in which a shunt interconnection layer is deposited on a transfer electrode and a manufacturing method thereof.

2. Description of the Related Art

Recently, solid-state imaging devices are widespread for use with audio-visual equipment such as a video camera or the like. In accordance with an increasing demand in which video cameras, for example, should become high in resolution and performance, solid-state imaging devices are requested to respond to an increasing demand for improvements of characteristics such as high-speed driving or the like.

In the solid-state imaging device, it is customary that transfer electrodes and parts such as interconnections connected to the transfer electrodes are made of polysilicon with application of semiconductor technologies.

However, since polysilicon is high in resistance value, it is unavoidable that a propagation delay occurs in polysilicon electrodes and polysilicon interconnections. As a result, solid-state imaging devices become difficult to operate at a high speed. Moreover, since the resistance value of polysilicon is high, polysilicon electrodes and polysilicon interconnections need sufficiently large cross-sectional areas. Accordingly, if areas of these polysilicon electrodes and polysilicon interconnections had been maintained sufficiently, it would not be easy to increase effective areas of the photosensor sections of the solid-state imaging device.

In order to obviate the above-mentioned defects, there have recently been proposed solid-state imaging devices including shunt interconnections as shown in FIGS. 1 and 2.

FIG. 1 shows a structure of a solid-state imaging device according to the related art in which a shunt interconnection 1 and a light-shielding film 2 are made of Al (aluminum). FIG. 2 shows a structure of a solid-state imaging device according to the related art in which a shunt interconnection 3 and a light-shielding film 4 are made of w (tungsten).

As shown in FIGS. 1 and 2, the solid-state imaging device includes a silicon substrate 5. On the surface-layer portion of this silicon substrate 5, there is formed a photosensor section (not shown) which converts a light signal into an electrical signal. As shown in FIGS. 1 and 2, the solid-state imaging device further includes a first transfer electrode 7 made of polysilicon and a second transfer electrode 8 made of polysilicon. The first and second transfer electrodes 7 and 8 partly overlap in the up and down direction with each other through an interlayer insulator film (not shown). The first and second transfer electrodes 7 and 8 have a buffer layer 9 made of polysilicon deposited thereon through an interlayer insulator film (not shown). The above-mentioned shunt interconnection 1 (3) is formed on the buffer layer 9 through an interlayer insulator film 10. The shunt interconnection 1 (3) is formed above the first and second transfer electrodes 7 and 8 in parallel to the first and second transfer electrodes 7 and 8. The shunt interconnection 1 (3) is electrically interconnected to the first and second transfer electrodes 7 and 8 through a contact-hole or window (not shown) bored through the interlayer insulator film 10. Further, the shunt interconnection 1 (3) has an interlayer insulator film 11 deposited thereon so as to cover the shunt interconnection 1 (3). This interlayer insulator 11 has the light-shielding film 2 (4) deposited thereon such that the light-shielding film 2 (4) covers the first and second transfer electrodes 7 and 8.

In the solid-state imaging devices having the above-mentioned structures, since the shunt interconnection 1 (3) is formed in parallel to the first and second transfer electrodes 7 and 8 made of polysilicon, their driving characteristics may be improved, and hence the solid-state imaging devices become able to operate at a high speed as compared with a solid-state imaging device in which the shunt electrode 1 (3) is not formed.

However, since the solid-state imaging devices shown in FIGS. 1 and 2 include the shunt interconnection 1 (3) and the buffer layer 9, the total thickness of the layers above the first and second transfer electrodes 7, 8 increases. In particular, in the solid-state imaging device shown in FIG. 1, the film thickness of the shunt interconnection 1 and the light-shielding film 2 made of Al (aluminum) increases comparatively, thereby resulting in shading of sensitivity being increased.

Further, since the number of the films comprising the transfer electrodes and the total thickness of the films comprising the transfer electrodes increase as described above, the photo-sensor section is damaged from a process standpoint when the respective films are removed on the portions above the photo-sensor section so that the resultant solid-state imaging device is damaged by increased illuminance defects.

Further, the transfer electrode of the solid-state imaging device is generally made of polycrystalline silicon. At that time, since the polycrystalline silicon of the transfer electrode has a high resistance value and a resistance becomes maximum, in particular, at the central portion of a picture screen, there occurs a propagation delay to make it difficult to drive the solid-state imaging device at a high speed.

Furthermore, when it is intended to increase the area of the solid-state imaging device, since it takes plenty of time to transfer an electric charge from the pixel located at the end of the solid-state imaging device, it is also difficult to increase the area of the solid-state imaging device.

In order to solve the above-mentioned problem, there is proposed a solid-state imaging device in which an interconnection layer made of a metal having a low resistance value, i.e. a so-called shunt interconnection layer is formed on a transfer electrode through an insulating film and this shunt interconnection layer is connected through a contact portion to the transfer electrode. According to the above-mentioned arrangement, since a logic signal travels through the shunt interconnection layer having a low resistance value, the solid-state imaging device becomes able to operate at a high speed.

FIG. 3 is a cross-sectional view illustrating a portion near a light-receiving section of a CCD (charge-coupled device)

solid-state imaging device 50 as an example of a solid-state imaging device in which a shunt interconnection layer is formed.

As shown in FIG. 3, this CCD solid-state imaging device 50 includes a semiconductor substrate 51 on which a light-receiving section formed of a photodiode or the like, a vertical charge transfer section for transferring an electric charge, a read section for reading a signal charge between the light-receiving section and the vertical charge transfer section and a channel-stop region for separating adjacent pixels although not shown. A transfer electrode 53 is formed on the region except the light-receiving section through an insulating film 54. FIG. 3 shows the cross-section of the portion in which the two transfer electrodes 53 overlap with each other through the insulating film 54.

Then, a shunt interconnection layer 55 made of a metal such as aluminum or the like is disposed on the transfer electrode 53 through the insulating film 54.

A light-shielding layer 56 is formed on the shunt interconnection layer 55 through the insulating film 54 so as to cover the whole of the imaging device. An opening 52 is defined on the light-receiving section through this light-shielding layer 56 and the light-shielding layer 56 is formed so as to cover the imaging areas other than the opening 52.

In this CCD solid-state imaging device 50, the shunt interconnection layer 55 is connected to the transfer electrode 53, whereby the resistance value of the transfer electrode 53 may be decreased and the propagation speed may be increased.

However, in the above-mentioned arrangement in which the shunt interconnection layer is connected to the transfer electrode, a channel potential is changed due to the change of a work function of the transfer electrode, and a contact resistance at the contact portion between the transfer electrode and the shunt interconnection layer increases.

SUMMARY OF THE INVENTION

In view of the aforesaid aspect, it is an object of the present invention to provide a solid-state imaging device and a manufacturing method thereof in which the solid-state imaging device may be driven at a high speed and in which a shading of sensitivity may be prevented from being increased and an illuminance defect may be prevented from being generated.

It is another object of the present invention to provide a solid-state imaging device and a manufacturing method thereof in which the solid-state imaging device may be driven at a high speed and in which a work function of a transfer electrode may be prevented from being fluctuated.

According to an aspect of the present invention, there is provided a solid-state imaging device which is comprised of a light-receiving sensor section provided on the surface portion of a substrate for performing a photoelectric conversion, a charge transfer section for transferring a signal charge read out from the light-receiving sensor section and a polysilicon transfer electrode formed on the substrate at the position approximately above the charge transfer section through an insulating film, wherein the polysilicon transfer electrode is formed by selectively depositing a high-melting point metal having a resistance value lower than that of polysilicon on a polysilicon layer.

According to this solid-state imaging device, since the polysilicon transfer electrode is formed by selectively depositing the high-melting point metal having the resistance value lower than that of polysilicon on the polysilicon layer, its resistance value is lowered as compared with a case in which a transfer electrode or an interconnection is made of only polysilicon.

According to another aspect of the present invention, there is provided a solid-state imaging device which is comprised of a light-receiving sensor section provided on the surface portion of a substrate for performing a photoelectric conversion, a charge transfer section for transferring a signal charge read out from the light-receiving sensor section and a polysilicon transfer electrode formed on the substrate at the position approximately above the charge transfer section through an insulating film, wherein the polysilicon transfer electrode has thereon a shunt interconnection provided in parallel to the transfer electrode or the shunt interconnection and the shunt interconnection is interconnected to the transfer electrode or an interconnection by selectively depositing a high-melting point metal or a high-melting point metal silicide through a contact-hole or window bored through an insulating film formed on the transfer electrode or the interconnection.

According to this solid-state imaging device, since the shunt interconnection is provided on the polysilicon transfer electrode in parallel to the transfer electrode or the interconnection, its resistance value is lowered by the shunt interconnection as compared with the case in which a transfer electrode or an interconnection is made of only polysilicon. Also, since the shunt interconnection is formed by selectively depositing the high-melting metal or the high-melting point metal silicide through the contact-hole bored through the insulating film on the transfer electrode, it is possible to alleviate the degree in which the total film thickness of the layers and parts on the transfer electrode increases and that the number of films comprising the transfer electrode and the film thickness of films comprising the transfer electrode increase.

According to other aspect of the present invention, there is provided a method of manufacturing a solid-state imaging device which is comprised of the steps of forming a light-receiving sensor section for photoelectric-converting an light incident on the surface portion of a substrate, forming a charge transfer section for transferring signal charges read out from the light-receiving sensor section, forming a polysilicon electrode layer on the substrate at the position approximately above the charge transfer section through an insulating film and forming a transfer electrode by selectively depositing a high-melting point metal having a resistance value lower than that of polysilicon on the polysilicon electrode layer.

According to a further aspect of the present invention, there is provided a method of manufacturing a solid-state imaging device which is comprised of the steps of forming a light-receiving sensor section for photoelectrically a light incident on the surface portion of a substrate, forming a charge transfer section for transferring signal charges read out from the light-receiving sensor section, forming a polysilicon transfer electrode on the substrate at a position approximately above the charge transfer section through an insulating film, forming a contact-hole on the insulating film after the insulating film is formed on the transfer electrode and forming a shunt interconnection on the transfer electrode in parallel to the transfer electrode by selectively depositing a high-melting point metal or a high-melting point metal silicide through the contact-hole.

According to a further aspect of the present invention, there is provided a solid-state imaging device which is comprised of a shunt interconnection layer formed of a metal layer and a buffer layer containing a metal silicide layer formed between a transfer electrode and the shunt interconnection layer.

According to a further aspect of the present invention, there is provided a method of manufacturing a solid-state imaging device which is comprised of the steps of forming a transfer electrode and forming a first insulating film on the whole surface of the transfer electrode, depositing a polycrystalline silicon layer after a contact-hole is bored on the first insulating film and forming a buffer layer by depositing a metal silicide layer on the polycrystalline silicon layer and forming a shunt interconnection layer on the upper layer of the buffer layer through a second insulating film having a contact-hole.

According to the above-mentioned solid-state imaging device of the present invention, since the buffer layer containing the metal silicide layer is formed between the transfer electrode and the shunt interconnection layer, it is possible to suppress the fluctuation of a work function of the transfer electrode.

According to the above-mentioned manufacturing method of the present invention, by forming the buffer layer comprising the polycrystalline silicon layer and the metal silicide layer, it is possible to form the buffer layer which can suppress fluctuation of the work function of the transfer electrode.

According to yet a further aspect of the present invention, there is provided a solid-state imaging device which is comprised of a shunt interconnection layer formed of a metal layer and a buffer layer containing a metal silicide layer formed between a transfer electrode and the shunt interconnection layer.

According to yet a further aspect of the present invention, in the above-described solid-state imaging device, the metal silicide layer contains the same metal as the metal making the shunt interconnection layer.

According to yet a further aspect of the present invention, in the above-described solid-state imaging device, the transfer electrode is formed of a polycrystalline silicon layer and the buffer layer is formed of a two-layer film comprising the polycrystalline silicon layer and the metal silicide layer.

According to yet a further aspect of the present invention, in the above-described solid-state imaging device, the metal silicide layer contains the same metal as that of the metal making the shunt interconnection layer.

According to yet a further aspect of the present invention, there is provided a method of manufacturing a solid-state imaging device which is comprised of the steps of forming a transfer electrode and forming a first insulating film on the whole surface of the transfer electrode, depositing a polycrystalline silicon layer after a contact-hole is bored on the first insulating film and forming a buffer layer by depositing a metal silicide layer on the polycrystalline silicon layer and forming a shunt interconnection layer on the upper layer of the buffer layer through a second insulating film having a contact-hole.

According to the present invention, the transfer electrode may be formed of a polycrystalline silicon layer, and the shunt interconnection layer may be formed of aluminum or high-melting point metal, e.g. a metal layer such as tungsten.

According to the present invention, the buffer layer may be formed of a two-layer structure of a polycide layer comprising a polycrystalline silicon layer, for example, and a metal and silicon compound, e.g. a high-melting point metal silicide such as tungsten silicide. In this case, the polycrystalline silicon layer of the polycide layer and the polycrystalline silicon layer of the transfer electrode are interconnected with each other, and the metal silicon compound layer in the polyside and the shunt interconnection are interconnected with each other.

Then, the transfer electrode and the buffer layer are interconnected with each other through the contact-hole bored through the insulating film formed between the transfer electrode and the buffer layer. Also, the buffer layer and the shunt interconnection layer are interconnected with each other through the contact-hole bored through the insulating film formed between the buffer layer and the shunt interconnection layer. In this case, the contact portion between the transfer electrode and the buffer layer and the contact portion between the buffer layer and the shunt interconnection should preferably be formed at the positions distant from each other.

DESCRIPTION OF THE PREFERRED EMBODIMENTS

A solid-state imaging device according to the present invention and a manufacturing method thereof will be described below in detail with reference to the drawings.

Figure 1:
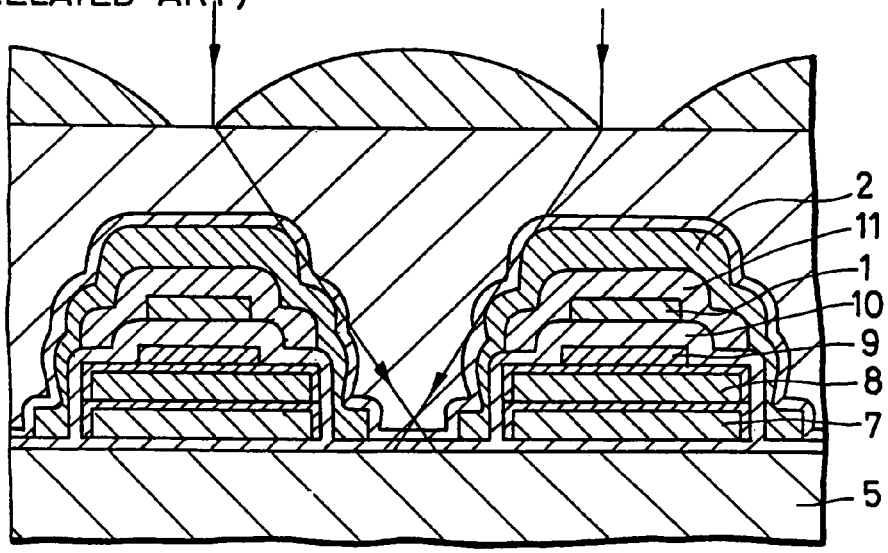
FIG. 1 is a fragmentary cross-sectional side view illustrating an example of a solid-state imaging device according to the related art in which a shunt interconnection and a light-shielding film are made of aluminum (Al)
Figure 2:
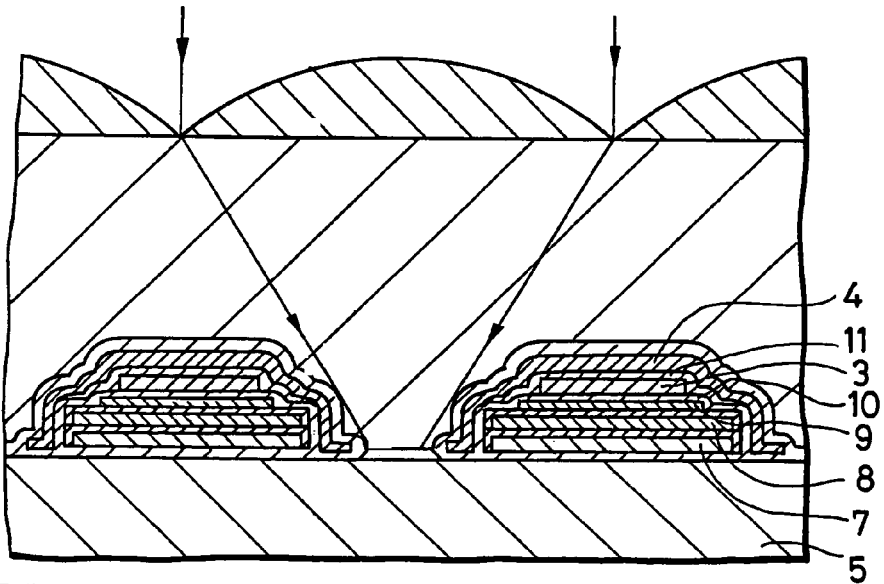
FIG. 2 is a fragmentary cross-sectional side view illustrating another example of a solid-state imaging device according to the related art in which a shunt interconnection and a light-shielding film are made of tungsten (W)
Figure 3:
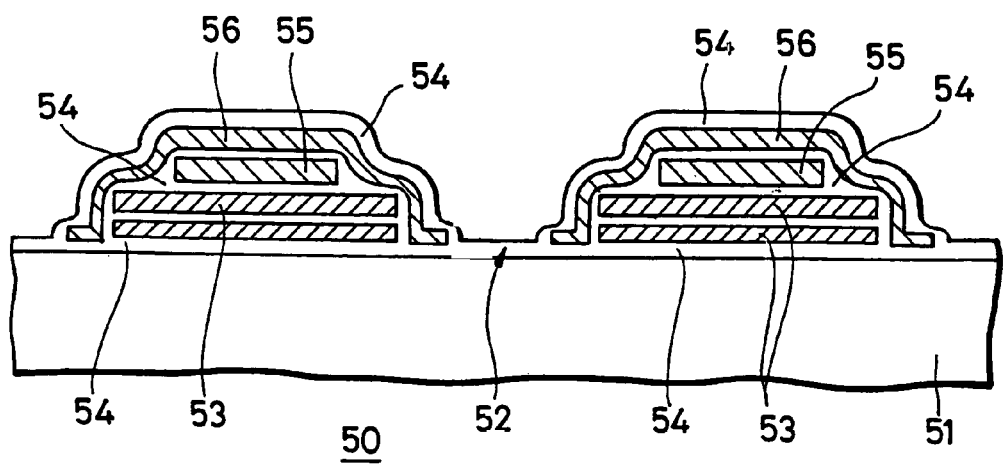
FIG. 3 is a cross-sectional view illustrating the portion near a light-receiving section of a CCD solid-state imaging device in which a shunt interconnection layer is formed.
Figure 4:
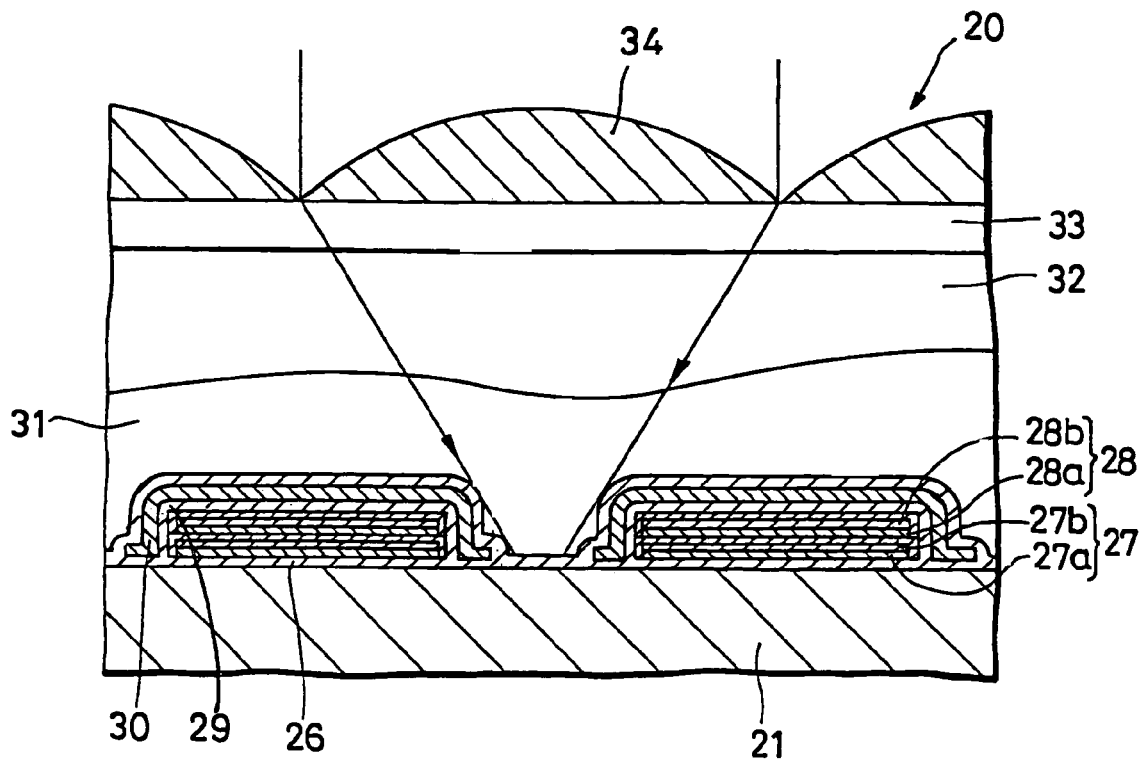
FIG. 4 is a fragmentary cross-sectional side view illustrating a solid-state imaging device according to a first embodiment of the present invention.

FIG. 4 is a fragmentary cross-sectional side view illustrating a solid-state imaging device according to a first embodiment of the present invention. In FIG. 4, reference numeral 20 denotes a solid-state imaging device, and reference numeral 21 denotes a silicon substrate (base). As shown in FIG. 4, the silicon substrate 21 has on its surface layer portion formed a light-receiving sensor portion (not shown) for performing a photoelectric conversion. A charge transfer section (not shown) is formed on one side of this light-receiving sensor section through a read gate (not shown). Another charge transfer section (not shown) is formed on the other side of the light-receiving sensor section through a channel-stop region (not shown). According to the above-mentioned arrangement, a signal charge photo-electrically-converted by the light-receiving sensor section is read out to the charge transfer section through the read gate and transferred by the charge transfer section.

The silicon substrate 21 has on its surface portion formed an $SiO_2$ insulating film 26 formed by a suitable method such as thermal oxidation, CVD (chemical vapor deposition) method or the like. The insulating film 26 is not limited to a single-layer film formed of the $SiO_2$ film and may be a laminated film having an ONO structure formed of three layers of $SiO2$ film-SiN film-$SiO_2$ film.

The insulating film 26 has at its position thereon approximately above the charge transfer section formed a first transfer electrode 27 made of first polysilicon. On the surface of this first transfer electrode 27, there is formed an electrode insulating film (not shown) so as to cover the first transfer electrode 27. Also, on the insulating film 26, there is formed a second transfer electrode 28 made of second polysilicon under the condition that the second transfer electrode 28 and the first transfer electrode 27 partly overlap with each other. This second transfer electrode 28 has on its surface formed an electrode insulating film (not shown) which covers the surface of the second transfer electrode 28.

The first transfer electrode 27 comprises a first polysilicon layer (polysilicon layer 27a) and a high-melting point metal layer 27b formed on this polysilicon layer 27a. The second transfer electrode 28 comprises a second polysilicon layer (polysilicon layer 28a) and a high-melting point metal layer 28b formed on this polysilicon layer 28a. The high-melting point metal layers 27b, 28b are formed by selectively depositing high-melting point metal having a resistance value lower than that of polysilicon on the polysilicon layer 27a (28a). In this embodiment, tungsten (W) is used as the high-melting point metal.

Tungsten (W) can be selectively deposited on the polysilicon layers 27a, 28a by depositing $WF6$ and $H2$ used as raw-material gases on the surfaces of the polysilicon layers 27a, 28a patterned as the shapes of the transfer electrodes 27, 28 by the CVD (chemical vapor deposition) method. Specifically, when the tungsten (W) film is deposited by the CVD method, if deposition conditions are set properly, then the tungsten (W) film is not deposited on an oxide film ($SiO_2$) and a nitride film (SiN) but the tungsten (W) film can be selectively deposited on only Si or silicide.

Accordingly, by effectively utilizing such features or property, in the process in which only the polysilicon layer of the polysilicon layer 27a of the first transfer electrode 27 is exposed and other portions are covered with the oxide film ($SiO_2$) and the nitride film (SiN), the tungsten (W) film is deposited by the CVD method. Similarly, in the process in which only the polysilicon layer of the polysilicon layer 28a of the second transfer electrode 28 is exposed and other portions are covered with the oxide film ($SiO_2$) and the nitride film (SiN), the tungsten (W) film is deposited by the CVD method, whereby the tungsten (W) films are selectively deposited on the polysilicon layer 27a and the polysilicon layer 28a, thereby making it possible to form the high-melting point metal layers 27b, 28b.

A mechanism in which tungsten (W) is deposited selectively will be described in the following equations:

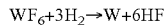

$$WF_6 + 3H_2 \rightarrow W + 6HF$$

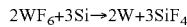

$$2WF_6 + 3Si \rightarrow 2W + 3SiF_4$$

On the first and second transfer electrodes 27, 28, there is deposited an interlayer insulator film 29 so as to cover the above-mentioned electrode insulating film (not shown). Further, a light-shielding film 30 made of Al or w is deposited on the interlayer insulator 29. The light-shielding film 30 is deposited under the condition that its one portion located above the light-receiving sensor section is opposed to the outside, i.e. it has an opening portion defined above the light-receiving sensor section.

An interlayer insulator film 31 is deposited on this light-shielding film 30, and further a planarization film 32 is deposited on the interlayer insulator film 31. Further, a color filter layer 33 is formed on the planarization film 32 and an on-chip lens 34 is formed on the color filter layer 33.

In the solid-state imaging device 20 thus arranged, since the first transfer electrode 27 and the second transfer electrode 28 are formed of the polysilicon layer 27a (28a) and the high-melting point metal layer 27b (28b) made of tungsten (W) having a resistance value lower than that of the polysilicon layer 27b (28b), as compared with the case in which these transfer electrodes 27, 28 are made of only polysilicon, its resistance value is lowered. Accordingly, the propagation delay is decreased to enable the solid-state imaging device 20 to be driven at a high speed. Also, in this example, since the shunt interconnection is not increased, the films comprising the transfer electrodes do not increase and the film thickness of the films comprising the transfer electrodes does not increase so that the shading of sensitivity and the illuminance defect can be prevented from being caused.

Figure 5:
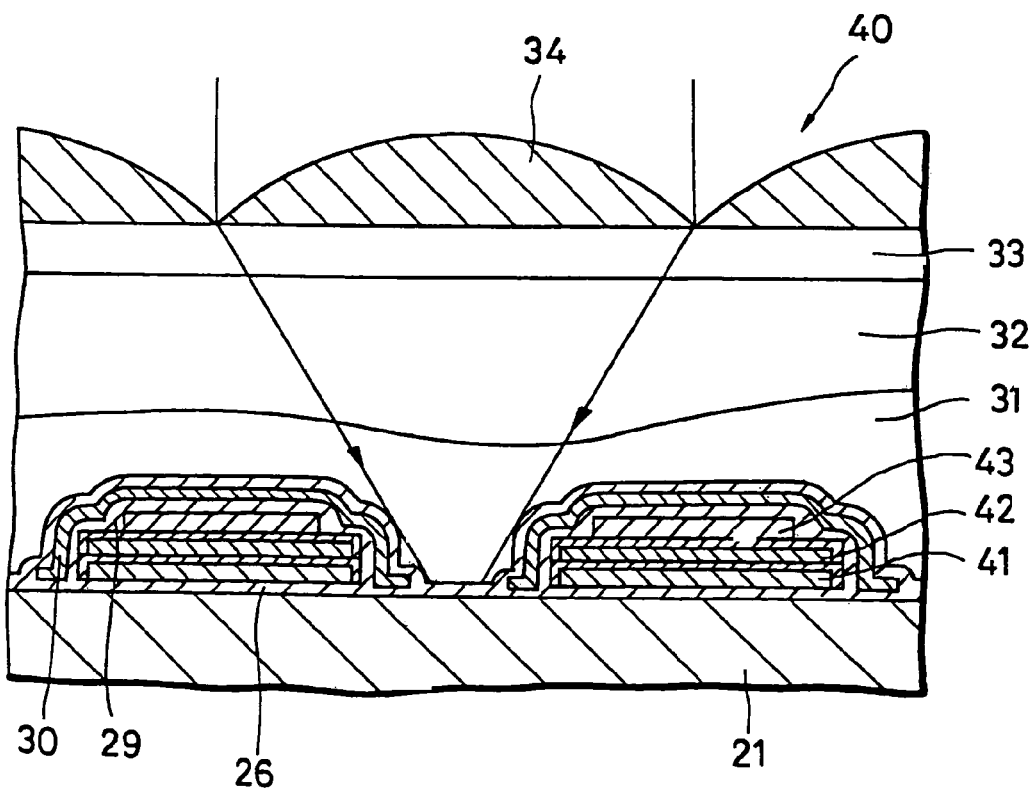
FIG. 5 is a fragmentary cross-sectional side view illustrating a solid-state imaging device according to a second embodiment of the present invention.

FIG. 5 is a fragmentary cross-sectional side view illustrating a solid-state imaging device according to a second embodiment of the present invention. In FIG. 5, reference numeral 40 generally denotes a solid-state imaging device. The solid-state imaging device 40 shown in FIG. 5 differs from the solid-state imaging device 20 shown in FIG. 4 4 in that first and second transfer electrodes 41, 42 and interconnections (not shown) connected to the first and second transfer electrodes 41, 42 are all made of only polysilicon and that a shunt interconnection 43 is formed on the first and second transfer electrodes 41, 42 and the interconnections connected to the first and second transfer electrodes 41, 42.

The shunt interconnection 43 is formed in parallel to the first and second transfer electrodes 41, 42 and is made of a high-melting point metal such as tungsten (W) or a high-melting point metal silicide such as $WSi_x$ (tungsten silicide) or the like. This shunt interconnection 43 is formed on a $SiO_2$ electrode insulating film (not shown) formed on the surfaces of the first and second transfer electrodes 41, 42. Also, this shunt interconnection 43 is electrically interconnected through a contact-hole or window (not shown) defined in the electrode insulating film (not shown) to the first transfer electrode 41 or the second transfer electrode 42 formed under the contact-hole.

Specifically, this shunt interconnection 43 is formed on the electrode insulating film by selectively depositing the high-melting point metal such as tungsten (W) and so on or the high-melting point metal silicide such as $WSi_x$ (tungsten silicide) and so on by the CVD method under the condition that the first transfer electrode 41 (second transfer electrode 42) made of polysilicon is covered with the $SiO_2$ electrode insulating film and is exposed to the outside only from the contact-hole.

In the solid-state imaging device 40 thus arranged, since the shunt interconnection 43 is formed on the first and second transfer electrodes 41 and 42, as compared with the case in which the first and second transfer electrodes 41, 42 and the interconnection interconnected to the first and second transfer electrodes 41, 42 by the shunt interconnection 43 are made of only polysilicon, the resistance values of the first and second transfer electrodes 41, 42 43 are lowered by the shunt interconnection 43 so that the propagation delay decreases, thereby making it possible to drive the solid-state imaging device at a high speed.

Since the shunt interconnection 43 is formed by selectively depositing the high-melting point metal or high-melting point metal silicide through the contact-hole (not shown) bored through the electrode insulating film (not shown) on the transfer electrodes 41, 42 or the interconnection, it is possible to reduce the degree in which the total film thickness of the transfer electrodes 41, 42 increases and that the number of films comprising the transfer electrodes 41, 42 and the film thickness of the transfer electrodes 41, 42 increase. Thus, it is possible to prevent the shading of sensitivity and the illuminance deflect from being caused.

As described above, in the solid-state imaging device according to the first invention, since at least one of the polysilicon transfer electrode and the interconnection is formed on the polysilicon layer by selectively depositing the high-melting point metal having the resistance value lower than that of the polysilicon, as compared with the case in which the transfer electrode is made of only polysilicon, the resistance value of the transfer electrode can be lowered. Accordingly, the propagation delay can be decreased so that the solid-state imaging device can be driven at high speed. Also, since the resistance value of the transfer electrode is lowered and the transfer electrode and the interconnection can be made thin, the sensitivity of the solid-state imaging device can be increased by increasing the effective surface area of the light-receiving sensor section.

Moreover, since the solid-state imaging device becomes able to operate at high speed, the shunt interconnection need not be formed. Accordingly, the number of the films comprising the transfer electrode and the thickness of the films comprising the transfer electrode can be prevented from being increased considerably. Thus, the shading of sensitivity can be avoided and the occurrence of the illuminance defect can be avoided as the number of etching and the time of etching increase.

In the solid-state imaging device according to the second embodiment, since the shunt interconnection is formed on at least one of the polysilicon transfer electrode and the interconnection in parallel to the transfer electrode or the interconnection, as compared with the case in which the transfer electrode or the interconnection is made of only polysilicon, the resistance value of the transfer electrode can be lowered by the shunt interconnection. Accordingly, the propagation delay can be decreased so that the solid-state imaging device becomes able to operate at high speed. Moreover, since the shunt interconnection is provided on at least the polysilicon transfer electrode and interconnection, the thickness of the transfer electrode and the interconnection can be decreased, accordingly, the sensitivity of the solid-state imaging device can be increased by increasing the effective surface area of the light-receiving sensor section.

Further, since the shunt interconnection is formed by selectively depositing the high-melting point metal or high-melting point metal silicide through the contact-hole bored through the electrode insulating film on the transfer electrodes, it is possible to increase the total film thickness on the transfer electrodes. Accordingly, the number of films comprising the transfer electrodes and the film thickness of the transfer electrodes can be prevented from being increased considerably. Thus, it is possible to prevent the shading of sensitivity from being caused. Also, it is possible to prevent the illuminance defect from being caused as the number of etchings increases and the time of etching increases.

Furthermore, according to the method of manufacturing a solid-state imaging device according to the third invention, it is possible to fabricate the solid-state imaging device having the above-mentioned excellent characteristics.

A solid-state imaging device according to a third embodiment of the present invention will now be described with reference to FIGS. 6 to 9.

FIGS. 6 to 9 are schematic diagrams showing a solid-state imaging device according to the third embodiment of the present invention. In the third embodiment shown in FIGS. 6 to 9, the present invention is applied to a frame interline type CCD solid-state imaging device.

As illustrated, a CCD solid-state imaging device 10 is driven by a four-phase clock signal, and a polycrystalline silicon layer of two layers functions as a transfer electrode. Specifically, a first-phase clock signal $\phi a$ or a third-phase clock signal $\phi c$ is applied to a polycrystalline silicon layer of the first layer. A second-phase clock signal $\phi b$ or a fourth-phase clock signal $\phi d$ is applied to the polycrystalline silicon layer of the second layer through a shunt interconnection layer and a buffer layer.

Figure 6:
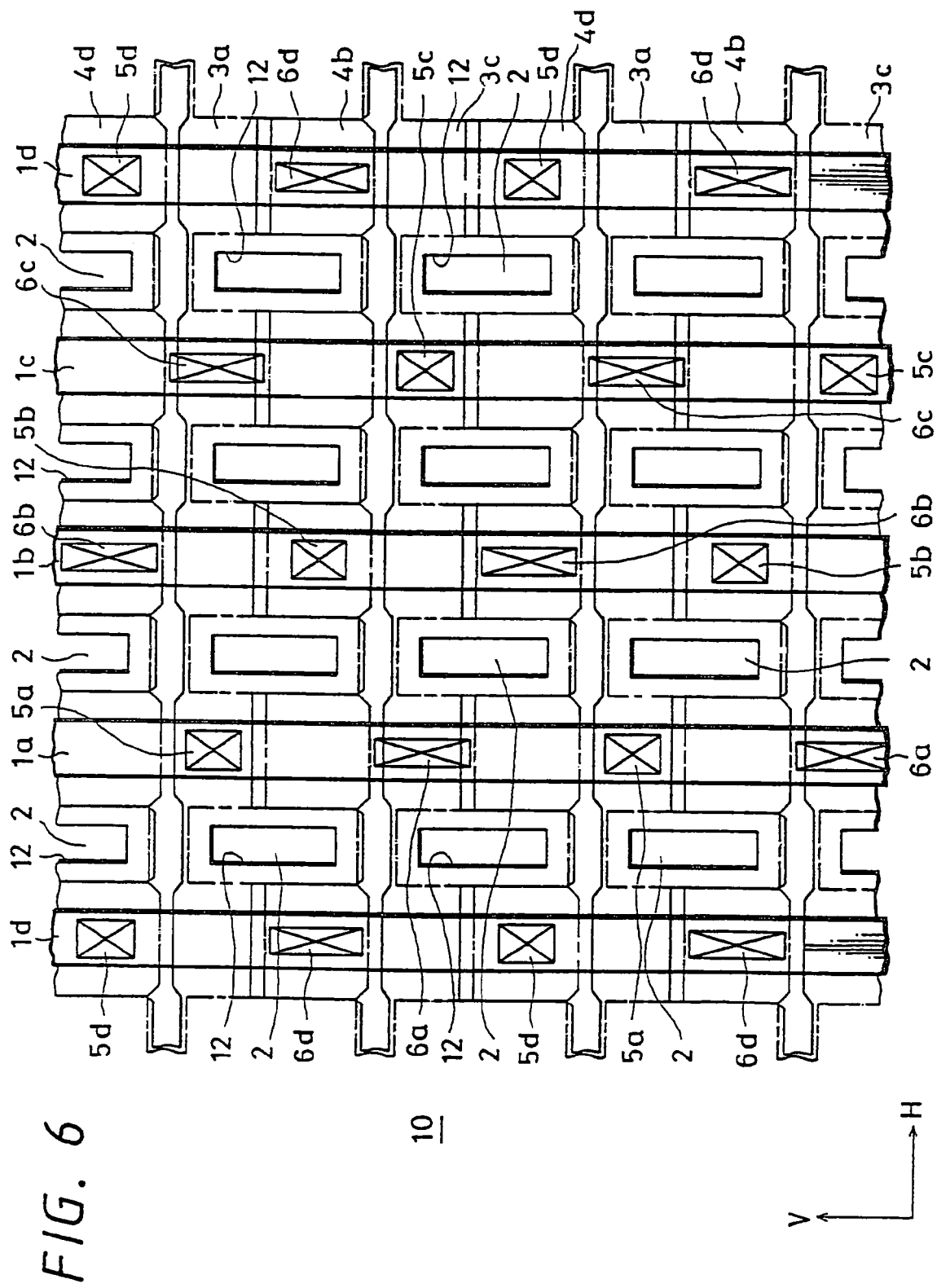
FIG. 6 is a plan view illustrating a main part of a solid-state imaging device according to a third embodiment of the present invention.

Initially, a layout of this frame interline CCD solid-state imaging device will be described with reference to FIG. 6. In FIG. 6, the V (vertical) direction becomes the charge transfer direction, and the H (horizontal) direction becomes the transfer direction of the horizontal register (not shown). A shunt interconnection layer 7 is not shown in FIG. 6.

A plurality of buffer layers 1a, 1b, 1c, 1d of approximately rectilinear patterns are disposed in the V direction, in that order. Vertical charge transfer sections (not shown) comprising a vertical CCD register are disposed under these buffer layers 1a, 1b, 1c, 1d, i.e. under transfer electrodes 3 (3a, 3c), 4 (4b, 4d). Shunt interconnections 7 of approximately rectilinear patterns are formed on the buffer layers 1a, 1b, 1c, 1d, respectively.

A sensor section 2 sectioned at every pixel is formed between the vertical charge transfer sections. The sensor section 2 comprises a photodiode, for example, and a window portion 12 of a light-shielding layer 8 and which is opened in the rectangular-shape along the V direction used as the longitudinal direction is formed on each sensor section 2.

Then, a channel-stop region (not shown) is formed on each sensor section 2 at its right-hand side of the sheets of drawings, and the channel-stop region and a read section (not shown) are formed on each sensor at its left-hand side of the sheets of drawings.

In this CCD solid-state imaging device 10, the transfer electrodes 3, 4 comprise polycrystalline silicon layers 3a, 3b of the first layer and polycrystalline silicon layers 4a, 4b of the second layer. These polycrystalline silicon layers 3a, 3b, 4b, 4d of the first and second layers are shaped as patterns such that they are horizontally extended along the H direction, widened on the vertical charge transfer section and are narrowed in the region between the sensor sections 2.

In the V direction, the polycrystalline silicon layer 3a of the first layer, the polycrystalline silicon layer 4b of the second layer, the polycrystalline silicon layer 3c of the first layer and the polycrystalline silicon layer 4d of the second layer are formed so as to surround the sensor section 2. The polycrystalline silicon layers 3a, 3c of the first layer and the polycrystalline silicon layers 4b, 4d of the second layer are disposed in such a manner that end portions of the polycrystalline silicon layers 3, 4 are overlapped with each other on a plane in a region between the sensor sections 2 and on a part of the vertical charge transfer section (see FIG. 7).

The first-phase clock signal $\phi a$ is supplied to the polycrystalline silicon layer 3a of the first layer through the shunt interconnection layer 7 and the buffer layer 1a, and the second-phase clock signal φb is supplied to the polycrystalline silicon layer 4b of the second layer through the shunt interconnection layer 7 and the buffer layer 1b. Also, the third-phase clock signal φc is supplied to the polycrystalline silicon layer 3c of the first layer through the shunt interconnection layer 7 and the buffer player 1c, and the fourth-phase clock signal φd is supplied to the polycrystalline silicon layer 4d of the second layer through the shunt interconnection layer 7 and the buffer layer 1d.

As shown in FIG. 6, the transfer electrode comprising the polycrystalline silicon layers 3a, 3c of the first layer or the polycrystalline silicon layers 4b, 4d of the second layer and the buffer layer 1 are interconnected with each other via contact-holes or windows 5a, 5b, 5c, 5d, and the buffer layer 1 and the shunt interconnection layer 7(not shown) are interconnected with each other via contact-holes 6a, 6b, 6c, 6d, respectively.

As shown in FIG. 6, the positions of the contact-holes 5a, 5b, 5c, 5d between the transfer electrodes 3, 4 and the buffer layer 1 are arranged in the oblique direction on the plane such that if the position is shifted by one vertical charge transfer section in the H direction, it is shifted by one transfer electrode in the V direction.

Also, the positions of the contact-holes 6a, 6b, 6c, 6d between the buffer layer 1 and the shunt interconnection layer 7 are shifted by approximately two transfer electrodes from the contact-holes 5a, 5b, 5c, 5d between the transfer electrodes 3, 4 corresponding to the same buffer layer 1 and the buffer layer 1, and are arranged in the oblique direction similarly.

Figure 7:
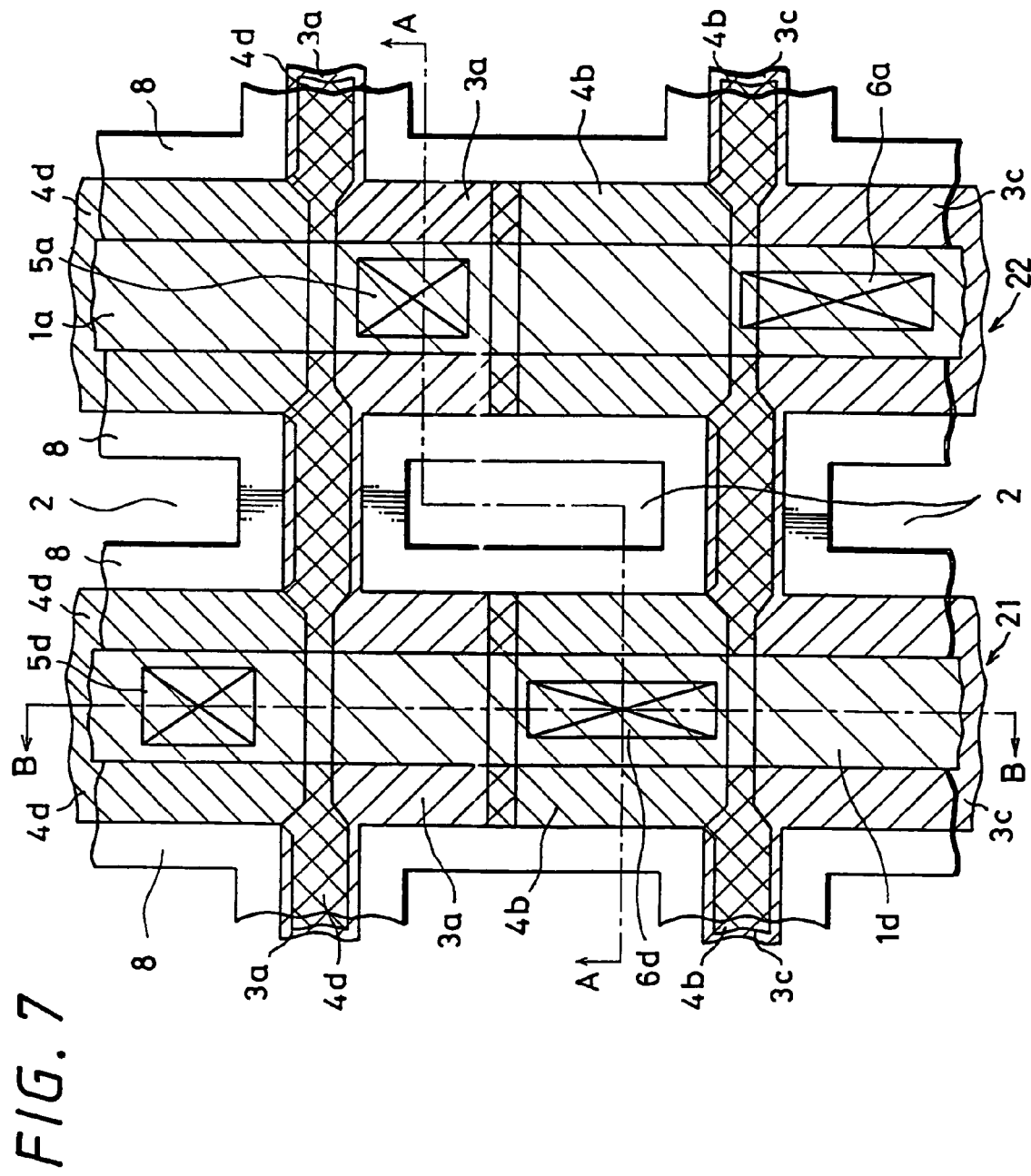
FIG. 7 is a fragmentary plan view illustrating a main part of the solid-state imaging device shown in FIG. 6 in an enlarged scale.
Figure 8:
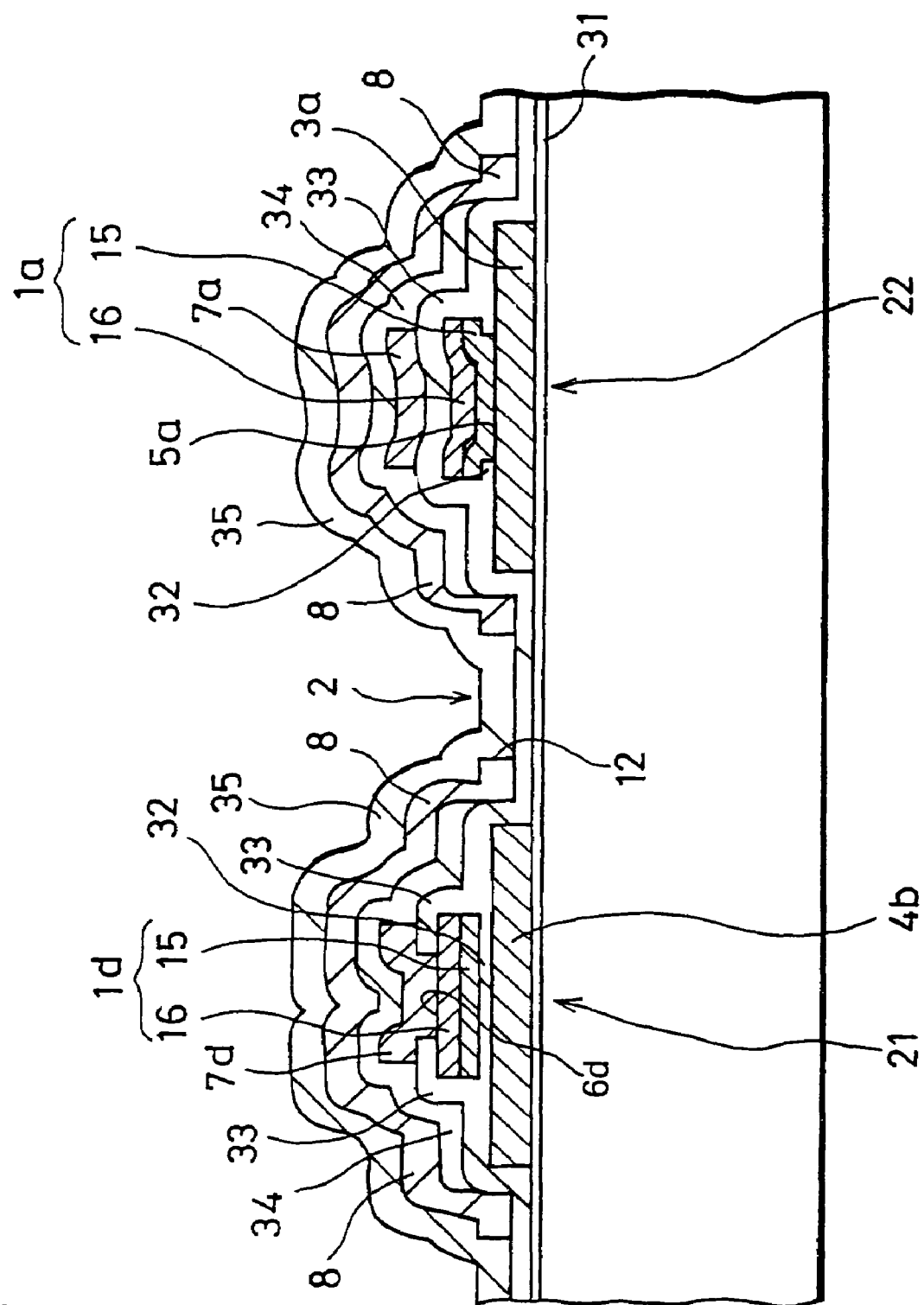
FIG. 8 is a cross-sectional view taken along the line A-A in FIG. 7.
Figure 9:
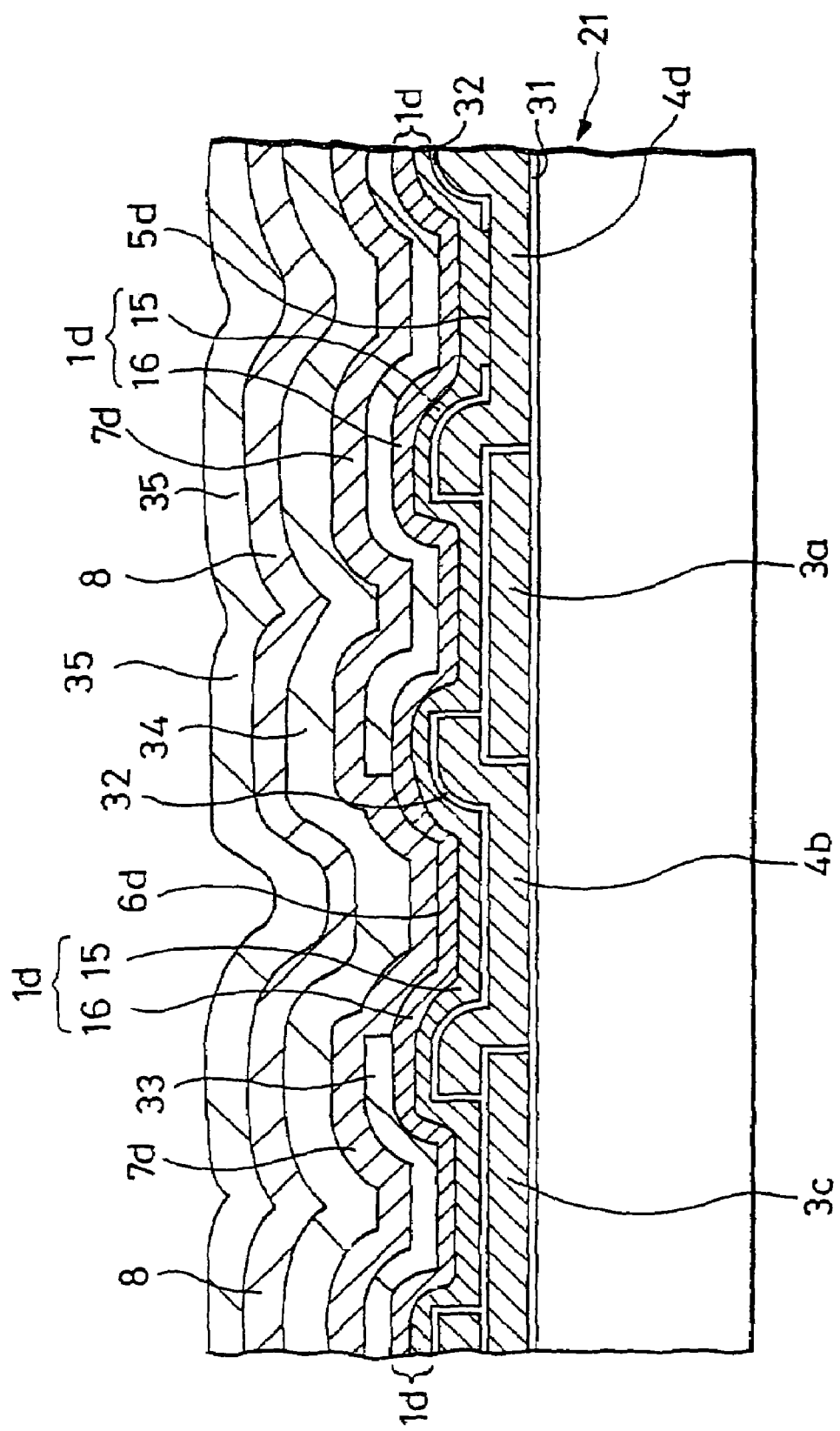
FIG. 9 is a cross-sectional view taken along the line B-B in FIG. 7.

Further, the structure of this CCD solid-state imaging device 10 will be described in detail with reference to FIGS. 7 to 9. FIG. 7 is a plan view illustrating a main portion corresponding to the two vertical transfer sections of FIG. 6 in an enlarged scale, FIG. 8 is a cross-sectional view taken along the line A-A in FIG. 7, and FIG. 9 is a cross-sectional view taken along the line B-B in FIG. 7.

There is provided the sensor section 2 between the two vertical charge transfer sections 21, 22 shown in FIG. 7. As shown in FIGS. 8 and 9, on the vertical charge transfer sections 21, 22, there is provided a transfer electrode through an insulating film 31. This transfer electrode comprises the polycrystalline silicon layer 3a of the first layer to which the first-phase clock signal φa is applied, the polycrystalline silicon layer 4b of the second layer to which the second-phase clock signal φb is applied, the polycrystalline silicon layer 3c of the first layer to which the third-phase clock signal φc is applied and the polycrystalline silicon layer 4d of the second layer to which the fourth-phase clock signal φd is applied.

A region between the polycrystalline silicon layers 3a, 3c of the first layer and the sensor section 2 serves as the read section.

The polycrystalline silicon layers 3a, 3c of the first layer and the polycrystalline silicon layers 4b, 4d of the second layer are alternately formed along the charge transfer directions of the vertical charge transfer sections 21, 22 through an insulating film 32. The polycrystalline silicon layers 4b, 4d overlap on the end portions of the polycrystalline silicon layers 3a, 3c of the first layer in the charge transfer direction.

Then, the buffer layers 1a, 1d are formed as approximately rectilinear patterns extended in the vertical direction (corresponding to the transfer direction) only on the respective vertical charge transfer sections 22, 21 and interconnected through the contact holes 5a, 5b bored through the insulating film 32 to the polycrystalline silicon layer 3a of the first layer and the polycrystalline silicon layer 4d of the second layer, respectively.

That is, the polycrystalline silicon layer 3a of the first layer and the polycrystalline silicon layer 4d of the second layer comprising the transfer electrode and the shunt interconnection layer 7 are not directly interconnected to each other but are connected to each other through the buffer layers 1a, 1d.

Then, these buffer layers 1a, 1d are respectively connected through contact-holes 6a, 6d bored through interlayer insulators 33, 34 to respective shunt interconnection layers 7a, 7d.

As a consequence, the first-phase clock signal φa is supplied to the polycrystalline silicon layer 3a of the first layer from the shunt interconnection layer 7a through the buffer layer 1a. The fourth-phase clock signal φd is supplied to the polycrystalline silicon layer 4d of the second layer from the shunt interconnection layer 7d through the buffer layer 1d. This is also true with respect to the second-phase and third-phase clock signals φb, φc.

The shunt interconnection layer 7 is made of metal such as aluminum and tungsten or the like, and should preferably made of a high-melting point metal.

In particular, when the shunt interconnection layer 7 is made of tungsten, a melting point of tungsten is high so that a temperature at which the interlayer insulator film is formed can be raised. Also, since the tungsten is excellent in coverage and withstand voltage, the shunt interconnection layer 7 can be formed thin.

Thus, the total thickness of the imaging device can be reduced so that the shading of sensitivity or the like can be improved.

When the shunt interconnection layer 7 is made of tungsten, the material of a light-shielding layer 8 is not limited in particular. However, when the light-shielding layer 8 is formed prior to the shunt interconnection layer 7, it is preferable to use a metal having a high melting point, e.g. the same material, such as tungsten or the like, as the shunt interconnection layer 7.

Moreover, the buffer layer 1 is formed so as to contain a metal silicide layer which is a compound of polycrystalline silicon and metal.

Thus, it is possible to suppress the fluctuation of work functions of the transfer electrodes 3, 4.

Preferably, as shown in FIGS. 8 and 9, the buffer layer 1 is formed of a two-layer structure (so-called polycide) of, for example, a polycrystalline silicon layer 15 and a metal silicide layer 16 or the like, whereby a contact resistance between the transfer electrodes 3, 4 made of polycrystalline silicon layer and the polycrystalline silicon layer 15 of the buffer layer 1 can be decreased sufficiently.

More preferably, the metal silicide layer 16 comprising the buffer layer 1 should be made of a compound of polycrystalline silicon and metal used in the shunt interconnection layer 7.

According to the above-mentioned arrangement, the fluctuations of the work functions of the transfer electrodes 3, 4 can be suppressed more effectively, and the contact resistance between the shunt interconnection layer 7 and the metal silicide layer 16 can be decreased sufficiently.

According to the above-mentioned embodiment, since the shunt interconnection layer 7 formed of the metal layer is connected to the transfer electrodes 3, 4, the resistance value of the transfer electrode can be lowered and the propagation delay can be reduced.

Since the propagation delay is reduced as described above, the solid-state imaging device can be driven at high speed. Also, since it becomes possible to transfer electric charges in a long distance, the area of the imaging device can be made large.

Moreover, the shunt interconnection layer 7 is not directly connected to the transfer electrodes 3, 4 but connected to the transfer electrodes 3, 4 through the buffer layer 1, whereby the fluctuation of the work functions of the transfer electrodes 3, 4 can be suppressed and the shift of the channel potential can be reduced.

When the shunt interconnection layer 7, in particular, is made of tungsten, if the transfer electrodes 3, 4 formed of the polycrystalline silicon layers and the shunt interconnection layer 7 are interconnected directly, then the contact resistance increases.

Here, if the shunt interconnection layer and the transfer electrode are interconnected through the buffer layer formed of only the polycrystalline silicon layer, then the contact resistance between the buffer layer formed of the polycrystalline silicon layer and the shunt interconnection layer made of tungsten is increased.

Accordingly, it is possible to decrease the contact resistance between the shunt interconnection layer 7 and the transfer electrodes 3, 4 by connecting the shunt interconnection layer and the transfer electrodes 3, 4 through the buffer layer containing the metal silicide layer, preferably, the buffer layer 1 of the two-layer structure in which the lower layer is the polycrystalline silicon layer 15 and the upper layer is the metal silicide layer 16.

In order to sufficiently demonstrate the effect for decreasing this contact resistance, the metal silicide layer 16 should preferably be made of the material containing the same metal as that of the shunt interconnection layer 7. That is, relative to the shunt interconnection layer 7 made of the material of tungsten, it is preferable to use tungsten silicide as the metal silicide layer 16.

While the transfer clock has been described so far as the four-phase transfer clock, the transfer clock may be a transfer clock of more than two phases and is not limited in particular. Also, the imaging apparatus using the solid-state imaging apparatus is not limited to the frame interline type and may be of an interline type.

The contact portion 6 between the buffer layer 1 and the shunt interconnection layer 7 may be connected onto the buffer layer 1 and may be formed on the contact portion 5 between the buffer layer 1 and the transfer electrodes 3, 4, i.e. the two contact portions 5, 6 may be located at the same position on the flat surface.

The solid-state imaging device 10 having the buffer layer 1 of the two-layer structure is formed as follows, for example.

Initially, the polycrystalline silicon layer of the first layer is deposited on the insulating film 31 covering the semiconductor substrate and patterned by a predetermined pattern, thereby forming the transfer electrode 3 comprising the polycrystalline silicon layer of the first layer.

After the insulating film 32 is formed so as to cover the transfer electrode 3 comprised of the polycrystalline silicon layer of the first layer, the polycrystalline silicon layer of the second layer is deposited on the insulating layer and patterned by the predetermined pattern, thereby forming the transfer electrode 4 comprising the polycrystalline silicon layer of the second layer.

The insulating film 32 is formed so as to cover the transfer electrode 4 comprising the polycrystalline silicon layer of the second layer.

Then, openings of contact portions 5 are bored through this insulating film 32 at its positions on the transfer electrodes 3a, 4b, 3c, 4d.

Then, the polycrystalline silicon layer 15 is deposited so as to cover the openings of the contact portions 5.

Further, the metal silicide layer 16 is deposited on the polycrystalline silicon layer 15 by the CVD (chemical vapor deposition) method and patterned in a rectilinear pattern as shown in FIG. 6, thereby resulting in the buffer layer 1 being formed.

Then, the insulating layer 33 is deposited on the whole surface of the buffer layer 1 and an opening for the contact portion 6 is bored through the buffer layer 1 of this insulating film 33 at its position distant from the above-mentioned contact portion 5.

Then, the metal layer such as tungsten or the like is formed so as to cover the opening of the contact portion 6 and is patterned in a rectilinear fashion similar to that of the buffer layer 1 to thereby form the shunt interconnection layer 7.

Then, the insulating film 34 is formed so as to cover the shunt interconnection layer 7, and thereafter the light-shielding layer 8 is formed on the insulating film 34.

Through the light-shielding layer 8 on the sensor section 2, an opening is bored such that the light becomes incident on only the sensor section 2.

Further, the insulating film 35 is formed on the whole surface of the light-shielding layer 8.

Thereafter, if necessary, a planarization layer for planning the upper surface and assemblies such as a color filter, on-chip lens and so on are fabricated, thereby resulting in the CCD solid-state imaging device 10 being manufactured.

In this manner, it is possible to easily manufacture the arrangement in which the buffer layer 1 comprising the metal silicide layer is formed between the transfer electrode 4 and the shunt interconnection layer 7.

While the shunt interconnection layer 7 is formed under the light-shielding layer 8 as described above, the present invention is not limited thereto and the shunt interconnection layer 7 may be formed on the upper layer of the light-shielding layer 8. In this case, in order that the shunt interconnection layer 7 and the buffer layer 1 may be interconnected with each other, the peripheral portions of these contact portions 6 may be patterned so as to remove the light-shielding layer 8 therearound.

The solid-state imaging device according to the present invention and the manufacturing method thereof are not limited to the above-mentioned embodiments and may be variously modified without departing from the gist of the present invention.

As described above, according to the present invention, since the resistance value of the transfer electrode is lowered by providing the shunt interconnection layer, the propagation delay may be decreased so that the solid-state imaging device may be driven at high speed.

Moreover, since the propagation delay is not increased even when the transfer distance increases, it becomes possible to fabricate a solid-state imaging device having a large area.

Further, according to the present invention, since the buffer layer containing the metal silicide layer is formed between the shunt interconnection layer and the transfer electrode, the fluctuation of the work function in the transfer electrode can be suppressed and the channel potential in the transfer electrode can be prevented from being shifted.

In particular, when the buffer layer is formed of the two-layer structure comprising the polycrystalline silicon layer and the metal silicide layer, it is possible to reduce the contact resistance between the transfer electrode comprising the polycrystalline silicon layer and the shunt interconnection layer comprising the metal layer.

Furthermore, according to the method of manufacturing a solid-state imaging device of the present invention, since the polycrystalline silicon layer is deposited and the metal silicide layer is deposited on the polycrystalline silicon layer to thereby form the buffer layer, it is possible to easily form the solid-state imaging device having the above-mentioned buffer layer.

Having described preferred embodiments of the invention with reference to the accompanying drawings, it is to be understood that the invention is not limited to those of the precise embodiments and that various changes and modifications could be effected therein by one skilled in the art without departing from the spirit or scope of the invention as defined in the appended claims.

What is claimed is:

1. A solid-state imaging device comprising:

light-receiving sensors for photoelectric-converting a light incident on the surface portion of a substrate;

a charge transfer portion for transferring signal charges from said light-receiving sensors;

a first insulating film on said substrate;

first polysilicon transfer electrodes and second polysilicon transfer electrodes, said first and second polysilicon transfer electrodes being formed on and in contact with said first insulating film approximately above said charge transfer portion, an end portion for one of said second polysilicon transfer electrodes overlapping one of said first polysilicon transfer electrodes, another end portion for said one of said second polysilicon transfer electrodes overlapping another of said first polysilicon transfer electrodes;

a second insulating film on said first and second polysilicon transfer electrodes;

a contact-hole through said second insulating film to expose said another of said second polysilicon transfer electrodes;

a polycrystalline silicon layer, a portion of said polycrystalline silicon layer being on and in contact with said second insulating film and another portion of said polycrystalline silicon layer being through said contact-hole to contact with said another of said second polysilicon transfer electrodes, said polycrystalline silicon layer being insulated from said one of said first polysilicon transfer electrodes and from said another of said first polysilicon transfer electrodes;

a metal silicide layer on and in contact with said polycrystalline silicon layer;

a third insulating film on and in contact with said metal silicide layer;

an opening through said third insulating film to expose said metal silicide layer, said opening being above said one of said second polysilicon transfer electrodes;

a shunt interconnection layer, a portion of said shunt interconnection layer being on and in contact with said third insulating film, another portion of said shunt interconnection layer contacting said metal silicide layer through said opening, said metal silicide layer and said shunt interconnection layer being of the same material;

a fourth insulating film on said shunt interconnection layer; and a light-shielding layer on said fourth insulating film, wherein said shunt interconnection layer is an aluminum layer, and wherein a phase clock signal is applied to said polycrystalline silicon layer through said shunt interconnection layer.

* * * * *